United States Patent [19]

Seipler

[11] Patent Number: 5,068,714
[45] Date of Patent: Nov. 26, 1991

[54] METHOD OF ELECTRICALLY AND MECHANICALLY CONNECTING A SEMICONDUCTOR TO A SUBSTRATE USING AN ELECTRICALLY CONDUCTIVE TACKY ADHESIVE AND THE DEVICE SO MADE

[75] Inventor: Dieter Seipler, Reutlingen, Fed. Rep. of Germany

[73] Assignee: Robert Bosch GmbH, Stuttgart, Fed. Rep. of Germany

[21] Appl. No.: 452,110

[22] Filed: Dec. 14, 1989

[30] Foreign Application Priority Data

Apr. 5, 1989 [DE] Fed. Rep. of Germany ....... 3910910

[51] Int. Cl.⁵ .......................................... H01L 23/485
[52] U.S. Cl. ........................................ 357/80; 357/67; 357/68; 357/69; 437/245; 437/243; 437/235; 437/209; 361/400
[58] Field of Search ............... 437/204, 235, 243, 244, 437/944, 946, 209; 29/829, 832, 846; 156/60, 273, 5; 357/65, 69, 71, 80, 67, 68; 427/96; 361/400

[56] References Cited

U.S. PATENT DOCUMENTS

| | | | |
|---|---|---|---|
| 3,292,240 | 12/1966 | McNutt et al. | 437/209 |
| 3,303,393 | 2/1967 | Hymes et al. | 361/411 |
| 3,517,279 | 6/1970 | Ikeda et al. | 357/68 |
| 3,795,047 | 3/1974 | Abolafia et al. | 156/273.9 |
| 4,069,791 | 1/1978 | Tobias | 118/120 |
| 4,157,407 | 6/1979 | Peiffer | 156/273.5 |
| 4,164,005 | 8/1979 | Cheseldine | 29/25.03 |
| 4,172,547 | 10/1979 | Delgrande | 228/121 |
| 4,234,626 | 11/1980 | Peiffer | 427/97 |
| 4,411,980 | 8/1983 | Haney et al. | 427/98 |
| 4,469,777 | 9/1984 | O'Neil | 29/846 |
| 4,572,764 | 2/1986 | Fan | 29/846 |
| 4,667,401 | 5/1987 | Clements et al. | 29/832 |
| 4,720,740 | 1/1988 | Clements et al. | 357/70 |
| 4,868,637 | 9/1989 | Clements et al. | 357/70 |

FOREIGN PATENT DOCUMENTS 62-90938 of 1987 Japan.
63-293894 of 1988 Japan.

Primary Examiner—Olik Chaudhuri
Assistant Examiner—David E. Graybill
Attorney, Agent, or Firm—Frishauf, Holtz, Goodman & Woodward

[57] ABSTRACT

To adhere a semiconductor chip or wafer substrate (10) to a carrier plate substrate (11) of, for example, ceramic, glass or the like, in which the two substrates carry exposed connection pads (13, 16), at least one of the substrates is coated with an adhesive electrically insulating, normally tacky material, which is exposed, by photomasking technology, in all areas except those where the pads are located, to cure the material. Metallic powder, typically silver, is then introduced into the remaining tacky portions of the layer, to render it conductive, and the two substrates are then pressed against each other, with the pads in alignment, the metal powder within the tacky insulating material forming an electrical connection between said pads. The insulating layer can be applied either to the semiconductor chip or wafer substrate or to the carrier plate substrate, or to both. Electrical connecting lines to the pads, on the surface of one of the substrates, are covered by the then cured electrical insulating layer. Preferably, the surface, and the connecting lines thereon, if used, are passivated before application of the adhesive layer which, then, is cured, except in the location of the pads.

27 Claims, 2 Drawing Sheets

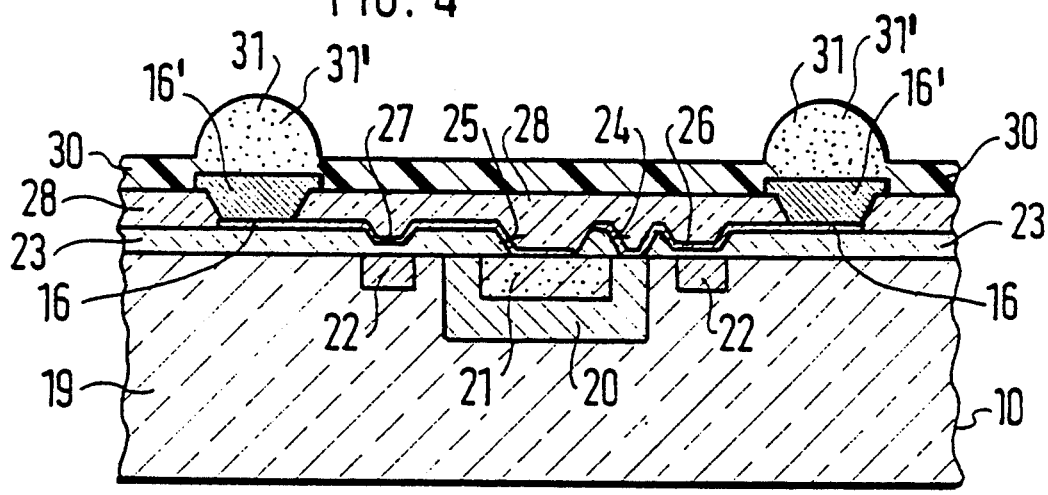
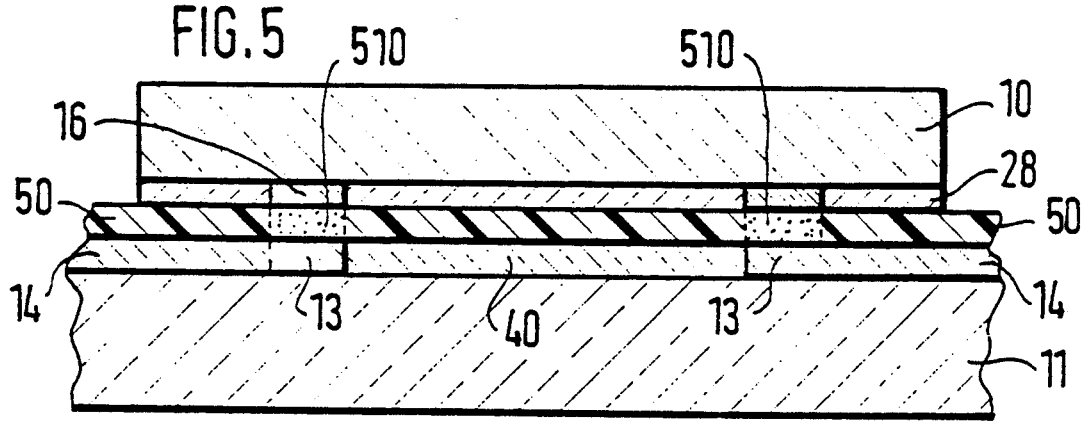
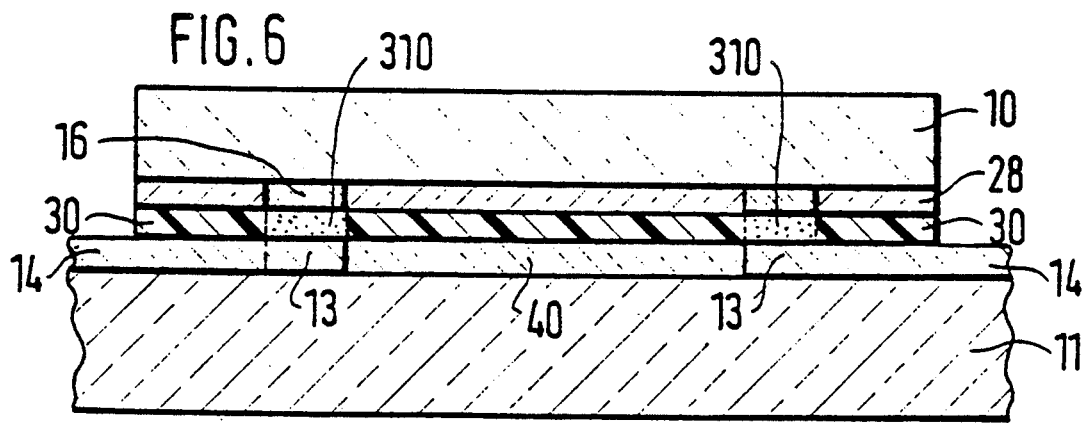

METHOD OF ELECTRICALLY AND MECHANICALLY CONNECTING A SEMICONDUCTOR TO A SUBSTRATE USING AN ELECTRICALLY CONDUCTIVE TACKY ADHESIVE AND THE DEVICE SO MADE

The present invention relates to a method to make a hybrid semiconductor structure, and to the hybrid semiconductor made by this method, and more particularly to a method, and a semiconductor chip, which has connection pads which are to be connected to similar connection pads on a carrier substrate which carries connection lines to terminals, or other connection arrangements.

BACKGROUND

It has previously been proposed to provide hybrid circuit networks in flip-chip technology. This technology refers to placing a semiconductor chip opposite a ceramic substrate which has metallic circuits thereon, and connecting the chip to the substrate by fusing a contact element, which may be spherical, between the pads of the chip and the substrate, see for example the referenced U.S. Pat. No. 3,292,240, McNutt et al. The solder in form of a small solder dot is customarily a lead-tin soft solder.

This technology, referred to as "flip-chip" or face-to-face technology since the chip or the substrate, respectively, are flipped above each other, has been improved, as described in U.S. Pat. No. 3,517,279, Ikeda, by not using tiny metal spheres or balls and rather applying a soft solder layer on the respective contact elements on the chip and/or the substrate, and then soldering the chip on the substrate by a re-flow solder process, utilizing the previously applied solder layer.

U.S. Pat. No. 2,303,393, Hymes, describes a connection method and system which is an improvement over that of U.S. Pat. No. 3,292,240, in that the terminal elements or pads are characterized as being essentially non-deformable, even if they are subjected to high temperature.

The connection arrangements described are difficult to make if the packing density of the lines is high, since the connection must be mechanically and electrically perfect, without, however, causing short circuit between adjacent lines. It is difficult to apply soft solder to the connection metallization lines of the semiconductor chip and/or the pads of the carrier substrate in such a quantity that, upon melting, the electrical connection will be excellent without, however, causing short circuits. Semiconductor elements which have very small, and closely spaced electrical contact metallization regions, can, therefore, be connected by the known flip-chip technology only with some limitations based on the geometric placement of the connection lines and the connection pads.

THE INVENTION

It is an object to provide a method to contact connection pads on a chip to connecting pads on a substrate which is fast, reliable and permits high packing density of the components; and to develop a semiconductor- carrier substrate connection structure which is mechanically and electrically reliable, while permitting close spacing of the electrical connections.

Briefly, a surface of a substrate carrier plate, for example a ceramic, has connecting pads thereon. A semiconductor substrate chip, for example an integrated circuit (IC), has likewise a plurality of connection pads which can be connected at the surface or internally of the chip to suitable electronic components formed therein.

In accordance with the invention, a layer of an electrically insulating adhesive which is photo-curable or photo-hardenable is applied to the surface of either the substrate carrier or on the surface of the semiconductor chip, or on both. By photo-masking technology, the adhesive electrically insulating layer is cured in those regions where there are no connecting pads. Thus, the layer is left unexposed and adhesive or tacky in the region where the connecting pads are located. A metal powder is introduced into these remaining adhesive regions, typically silver powder or some other suitable diffusable metallic, and electrically conductive material, so that the remaining adhesive regions will become electrically conductive. The pads, with the now electrically conductive, adhesive coating thereon, are aligned with each other and engaged against each other, so that the electrically conductive adhesive regions, above the respective pads on one, or the other, or both of the substrates, will connect the opposite pad, or electronically conductive coating. Thus, the connection pads of the semiconductor substrate chip are electrically and mechanically connected by the adhesive with the pads of the substrate carrier plate, typically the ceramic. After the assembly the composite structure is cured at high temperature. In accordance with a feature of the invention, the resulting article can then be used as such, or further threaded.

The method has the advantage that semiconductor chips having tightly packed connecting pads or lines can be connected to substrates without limitations as to the geometry. The cured insulating layer provides for insulation of any exposed metallic or semiconductive surfaces other than the actual connections at the connection pads.

In accordance with a feature of the invention, the connecting pads can be reinforced. Preferably, the reinforcement is made of nickel and/or silver or gold and forms a reinforcing layer of nickel and/or silver or gold. This reinforcement also permits easier contact because of protruding contact areas.

In accordance with a preferred feature of the invention, and when connecting lines are placed on either one or both of the substrate plate or on the chip, the connecting lines are first passivated. The photo-sensitive adhesive layer is than applied over the passivating layer on the respective substrate or chip and cured, leaving, however, the regions above the pads uncured. Photo-masking technology, as well known, can be used to mask the regions which are to be left uncured. The metallic powder, preferably silver, is then introduced into the regions which are uncured and still adhesive, and the powder is dispersed within that region, e.g. under vibration, to form a subassembly of a carrier plate or chip, respectively, which has a double insulating layer, namely the passivating layer and the hardened or cured adhesive, leaving, however, the regions of the pads now conductive and uncured. Electrical connections then are made by placing the chip and the substrate against each other, with the pads in alignment.

Ultraviolet light is suitable for curing the photocurable adhesive in the first phase, high temperature curing after the assembly.

The system permits accurate positioning of elements with respect to each other with high density and minimum spacing. Automatic machinery can be used, and it is possible to provide for alignment with spacings as small as about 20 micrometers, and even less. Tolerances in the region of about 1 micrometer can readily be obtained by photo-technology customarily used in connection with monolithic integrated semiconductor circuits. The adhesive layer exposure, leaving the adhesive portions above the pad unexposed, can also use tolerances in the order of 1 micrometer and even less. Minimal overlap of adhesive material will obtain and, thus, there is only minimum danger of any spreading of adhesive material or the metallic powder therein. Positioning of the semiconductor with respect to the carrier substrate, in automatic positioning apparatus, permits ready maintenance of tolerances of less than 20 micrometers. The area of the connecting metallizations of the semiconductor chip as well as the area of the pads on the carrier substrate can be reduced to a diameter which is up to under 50 micrometers, with center-to-center spacing of the lands of the pads of less than 100 micrometers.

After the chips are placed against each other, so that the uncured, still adhesive portions will adhere together or against the opposite pad, the whole surface of the chip is pressed against the surface of the substrate, which provides for electrical connection at the pads and forms in addition a complete surface contact between the chip and the substrate. This ensures mechanical strength and good thermal contact It is not necessary to clamp or pot the combination together, but a passivation gel, such as a dielectric gel, is preferably applied to protect the entire hybrid or composite structure, as well known and standard procedure in connection with the manufacture of ICs.

The adhesive layer needs to be cured on only one of the substrates, to selectively hold the conducting particles on the tacky portions, and prevent application of conductive particles of the remaining portion. The other one of the plates to be joined together, be it the substrate or the chip, can remain uncured throughout, and it is not necessary to introduce metallic powder above the pads. It can be done, but increases the cost. If the chip and substrate are then placed against each other, the uncured adhesive will adhere over the cured adhesive and the metallic particles or powder above the pad in one of the elements will migrate and be squeezed into the opposite uncured portion, to effect the electrical contact.

A suitable thickness for the adhesives is about 5-10 micrometers, and the particle size can be up to 5 micrometers, for example between 1to 5 micrometers in diameter. Under some circumstances, and for some applications, application of vibration to cause dispersion of the particles above the pads may be desirable, but it is not necessary. Rather than vibration, one may use centrifuging to cause dispersion of the metallic powder.

Basically, the invention is directed to provide a new technology for microcontacting between semiconductor chips and hybrid substrates with the capability to interconnect the whole surface of the chip and substrate with specific electrical connection geometries of less than 50 micrometers in diameter, while ensuring good thermal contact of the chip and the substrate and good mechanical strength, throughout. This is obtained by using a photoformable contacting adhesive material which is selectively made conductive by applying finely dispersed metal in the regions of the connecting tabs.

DRAWINGS

FIG. 4 is a vertical cross-sectional view through an integrated circuit portion and including metallized adhesive regions above connecting pads or lands;

FIG. 5 is a combined view of a hybrid circuit in which the adhesive layer is applied to the ceramic substrate, before final compression; and FIG. 6 is a view similar to FIG. 5 in which the adhesive layer is applied to the semiconductor chip, before final adhesion.

DETAILED DESCRIPTION

Figure 1:
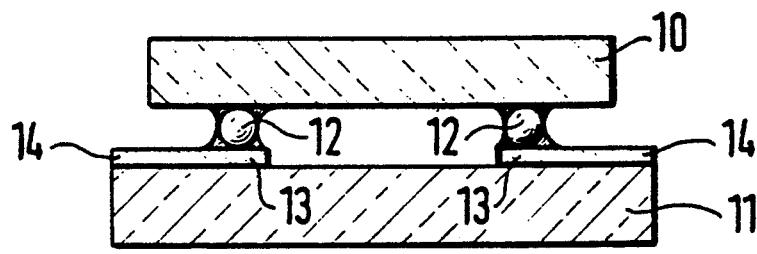
FIG. 1 is a schematic cross-sectional view through a hybrid circuit made in flip-chip technology according to the prior art.

FIG. 1 shows a prior art connecting system for face-to-face or "flip chip" composite semiconductors see for example, the referenced U.S. Pat. Nos. 3,292,240 and 3,303,393. A semiconductor element 10 is placed in electrically conductive connection to a substrate carrier 11, the connection being made by a metal sphere 12. Connecting lines on the semiconductor chip 10, not shown in FIG. 1, connect the spheres 12 to suitable external or internal electrical connections. The spheres 12 located within the outline of element 10 after being molten or solder-connected, as shown in FIG. 1, will connect these lines to external connection lines 14 formed on the substrate 11, for example made of ceramic material. The metal sphere contacts 12 are made of lead-tin soft solder, and connected to lead-tin soft solder on the respective connection lines on the semiconductor chip 10 as well as the lines 14 on the ceramic substrate 11. The end portions or lands or pads 13 form the terminal regions of the conductors 14 which, in turn, form the connecting pattern on the carrier or substrate plate 11.

Figure 2:
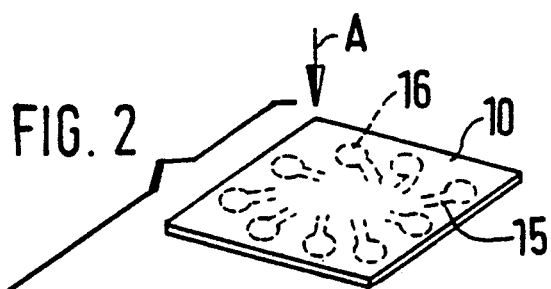
FIG. 2 is an exploded perspective view in advance of the application of a semiconductor chip on a carrier substrate.

The present invention and the method in accordance therewith is best seen by considering FIG. 2, which shows a portion of a hybrid circuit in exploded, perspective view before the semiconductor chip substrate element 10 is electrically and mechanically connected to the substrate plate 11. Connection is in the direction of the arrow A. The broken lines 10a on the substrate 11 indicate the region on which the chip 10 is to be placed upon contacting. The semiconductor chip 10, as shown in FIG. 2, has a plurality of connection metallizations 15 on the bottom surface thereof, hence shown only in broken lines. The connection metallizations 15 terminate in pads or lands 16 within the outline, or end edges of the chip 10; further connections to semiconductor elements on the chip 10 may be at the under-surface of the chip 10, or may be formed within the chip 10, as well known in semiconductor technology.

A passivating layer can be placed on the metallic connections 15 extending from the pads or lands 16 at the bottom surface of the chip 10, and over all the chip 10, leaving, however, the pads or lands 16 exposed. Similarly, the lands 13 on the carrier plate are connected to connection lines 14 thereon. The connection lines 14 need not be direct electrical connections but may include circuit elements. Shown by way of example, the circuit network of the substrate carrier plate 11 illustrates a thick-film resistor 17 and a thin-film resistor 18. The resistor 18, also, can be considered, in dependence on the frequency with which the chip is to be used as a resistance - inductance element. A passivating layer, not shown in FIG. 2, is placed over the entire connection network pattern 14, 17, 18, leaving the lands or pads 13 blank.

In accordance with a feature of the invention, and in order to form an electrically conductive connection between the pads 16 on the semiconductor chip substrate 10 and the pads 13 on the carrier substrate 11, an electrically non-conductive photo-sensitive adhesive layer is placed over the facing surface of either the substrate plate 11, or the chip 10, entirely covering the respective surface. In the region of the connecting pads, an electrically conductive material is introduced. Those regions of the adhesive layer, other than where the electrically conductive material is, are cured or hardened, preferably before introducing the electrically conductive material, by use of well known and standard photo-lithographic processes, as will be described in detail below.

The semiconductor chip 10 is applied to the carrier plate 11 in the position shown in broken lines 10a in FIG. 2. Upon such connection, a mechanical and electrically conductive bond will be formed between the connection pads 16 of the chip 10 and the pads 13 of the substrate 11, by adhering the pads together by means of the still uncured adhesive which has been rendered electrically conductive over the respective pads by the mechanical powder or insert material.

Figure 3:
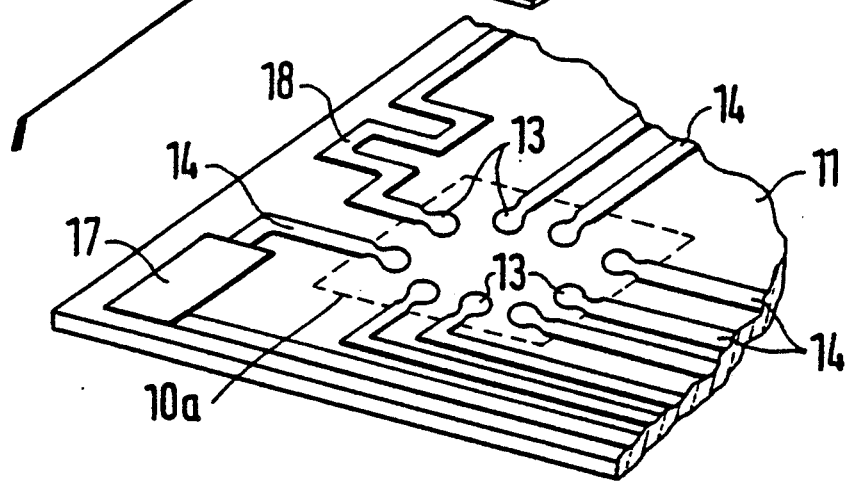
FIG. 3 is a highly schematic vertical cross-sectional view through a carrier substrate having metallized surface regions at the connecting pads.
Figure 3:
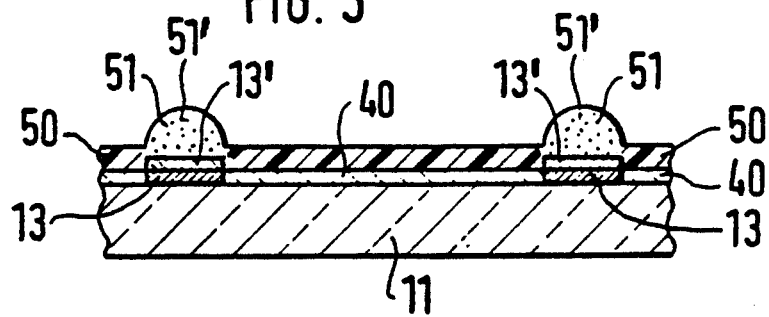

FIG. 3 is a highly enlarged fragmentary cross section through the substrate plate 11 of FIG. 2, intersecting two adjacent pads 13. A passivating layer 40 is applied over the entire layer 11 except for the surface of the pads 13. The surface of the pads 13, which, for example, may be made of aluminum, have only a limited electrical conductivity. In accordance with a preferred feature of the invention, cover layers 1 of nickel and/or silver or gold are placed over the pads 13 to provide a reinforcement, extending above the passivating layer 40. An electrically non-conductive, photo-sensitive adhesive layer 50 is then applied over the entire surface which, by means of photo-masking, is exposed in the region outside of the pads 13, reinforced by reinforcements 13', and will be cured and hardened thereby. The regions 51 of the adhesive layer 50 which are above the pads 13, and which have not been exposed, will remain adhesive. An electrically conductive material is introduced into these regions 51. This increases the volume of the regions 51, as schematically shown in FIG. 3. The regions 51 will bulge outwardly somewhat, and, by introduction of the electrically conductive material, will have become electrically conductive. Introduction of the electrically conductive material, for example pulverized silver or the like, can be carried out with the assistance of vibration, shaking, or of centrifugal force. The metal particles are shown schematically by the stippled representation 51' (FIG. 3); 31' (FIG. 4) and 510, 310 (FIGS. 5, 6).

FIG. 4 illustrates an integrated circuit (IC) semiconductor chip 10, in highly schematic fragmentary cross-sectional form. The IC shown in FIG. 4, for purposes of illustration, is a bi-polar power transistor, made in planar IC chip technology. The invention is not limited to such hybrid circuits with semiconductor elements as described but, rather, can be used with any type of IC, to be adhered to a substrate, for example by the well known flip-chip technology, as described in the referenced U.S. patents, and may be used with any circuits in which semiconductor elements are to be connected to connection substrates with numerous and preferably finely drawn connection structures. Highly integrated semiconductor circuits with many closely spaced connection metallizations are a particularly suitable field for the application of the present invention.

Referring now to FIG. 4: A disk-like chip of monocrystalline silicon forms a substrate 19, doped to have a predetermined conductivity type. A base zone 20 is diffused into the substrate, with conductivity opposite to that of the substrate type. An emitter zone 21, of the same conductivity as the substrate is diffused into the base zone. A ring-shaped collector diffusion zone 22 is diffused into the substrate, surrounding the base 20, in ring form. The emitter zone 22 can be diffused into the substrate at the same time as the collector zone 22. The respective diffusion processes—all known by themselves—will form a silicon dioxide layer 23 on the upper side of the substrate 19.

The base zone 20 and the emitter zone 22 have to be contacted and, therefore, the silicon dioxide layer 23 is etched to form contact windows 24 and 25 to the base and emitter, respectively. Additional contact windows to contact the collector diffusion zone 22 have been omitted from FIG. 4, since they are in a different plane than the two contact windows 24, 25. A network of conductive strips 26, 27 is applied to the surface of the passivating layer 23, which, in turn, is formed over the surface of the substrate 19.

The conductive path or strip 26, as shown in FIG. 4, is made of aluminum, and connects the base 20; an aluminum strip 27 connects the emitter zone 21.

The conductive strip 26 leads from the contact window 24, where it engages the base zone 20, over the passivating silicon dioxide layer 23 up to a point which forms the external connection of the base zone 20. It is there terminated in a connecting pad or land 16. The conductive strip 27 leads from the contact window 25, where it engages the emitter zone 21, over the passivating silicon dioxide layer 23 up to an external point where it forms the out connection for the emitter zone 21, and, there, ends in a further connecting metallization land or pad 16, for external emitter connection.

In accordance with a feature of the invention, a passivating layer 28 is applied over the connecting strips 26, 27, and over the first passivating layer 23 leaving, however, the pads 16 free. Photo-masking technology is used to selectively apply the passivating layer 28 where the connecting pads 16 are located.

The surface of the connection metallization forming pads 16 has only limited electrical conductivity and, to improve the connection, a cover layer 16' of nickel and/or silver or gold is applied to the pad 16 after the passivating layer 28 has been formed. The covers 16' so reinforce the connecting pads that they extend above the passivating layer 28.

In accordance with a feature of the invention, an adhesive layer 30 is applied over the entire surface of the passivating layer 28 and of the reinforced connecting pads 16, 16'. In those portions where the connecting metallization pads 16, 16' are located, an electrically conductive material 31' is introduced. Introduction of the electrically conductive material, preferably in powder or pulverized form, increases the volume of the adhesive layer above the connecting pads 16 and the reinforcements 16', so that the regions will be bulged outwardly, as shown in FIG. 4. The metal powder is shown schematically in stippled form at 31'.

Manufacture of hybrid circuit, with reference to FIGS. 5 and 6:

The substrate plate 11 (FIG. 5) has a network pattern, as explained in connection with FIG. 3, applied thereon, and a passivating layer 40 in those locations where there are no connecting pads 13. A photo-sensitive adhesive layer 50 is applied over the entire surface of the substrate plate 11, namely over the passivating surface 40, the connecting lines 14 and the pads or lands 13. As the next step, the photo-sensitive surface 50 is so exposed, utilizing photo-masking technology, that it will harden in the region outside of the lands or pads 13, but will remain moist, tacky, and uncured above the lands or pads 13. The locally hardened, but partially moist layer 50 then has electrically conductive pulverized material, preferably silver, applied thereto which will adhere to or penetrate into the region above the pads 13, for example by additional use of vibration or centrifugal force. The so prepared substrate 11 then will have the semiconductor element 10 placed thereover. The semiconductor element 10 may be similar to that described in connection with FIG. 4, namely include conductive strips 26, 27, over which a passivating layer 28 has been placed. The chip 10 is so fitted against the substrate 11 that the connecting pads 16 of the semiconductor element 10 are in alignment with the pads 13 on the substrate 11, which have been made conductive by the electrically conductive material introduced therein. An adhesive connection, which also forms an electrical connection, will then be formed between the pads 13 and the pads 16 by the conductive connection region 510.

FIG. 5 shows the spacing between the chip 10 and the carrier substrate 11 highly exaggerated. A typical thickness for the adhesive layer 50 is in the low micrometer range, for example about 5-10 micrometers or so. The metal powder 510 need not penetrate the adhesive before assembly, but it may only be necessary that it sticks on the still moist surface, and will be pressed thereinto during assembly. Upon assembly the layers 28 will fit against the layer 50 to form a closed composite. FIG. 5 illustrates the position of the substrate 11 with respect to the chip 10 just before a tight connection is made, and to better illustrate the process.

It is not necessary that the adhesive layer is applied to the carrier substrate 11; FIG. 6 illustrates the reverse, in which the adhesive layer 30 is applied over the semiconductor 10 (see FIG. 4). Of course, the adhesive layer may be applied over both the carrier substrate 11 (FIGS. 3, 5) as well as over the semiconductor 10 (FIGS. 4, 6).

Referring now to FIG. 6:

The chip or wafer 10 (FIG. 4), together with the conductive network 26, 27, and with the passivating layer 28, has the photo-sensitive adhesive layer 30 applied thereto. Thereafter, the photo-sensitive layer is exposed, using photo-masking technology, in such a manner that the region outside of the connecting metallizations, namely the pads 16, will harden or cure, but will remain moist and material-acceptable above the pads 16. The conductive material, typically pulverized silver, is then introduced over the adhesive layer, where it will adhere to the still moist, tacky adhesive above the pads. If required, it can be diffused within the layer by mechanical handling, such as vibration, shaking or centrifugal force. The chip 10, with the respective semiconductor elements therein already formed is then separated into the individual elements, if desired, and the so prepared semiconductor chip 10 is then so placed on the substrate plate 11, which has the passivating layer 40 thereon (see FIG. 5),that the connecting metallizations or pads 16 from the chip 10 are in alignment with the metallizations or pads 13 of the substrate 11. Electrical and mechanical connection is effected by the adhesives, still remaining adhesive and uncured, above the regions of the pads 13, 16, to provide an electrical connection as shown at 310.

Various changes and modifications may be made, and the invention is not limited to the examples shown in the drawings, nor to the specific method of manufacture. For example, the passivating layers 28, 40 are not strictly necessary, since the hardened, electrically cured portion of the adhesive layers 30, 50, which have been cured by photolithographic processes, provide an insulating layer and take over the function of the passivating layer.

The reinforcing layers 13', 16' (FIGS. 3, 4) are not strictly necessary, particularly if the pads 13, 16 are compatible with the adhesive and can become adhesive upon application of the respective adhesive layer, and especially if they are already made of nickel and/or gold.

A suitable material for the carrier substrate 11 is aluminum oxide ($Al_2O_3$) or aluminum nitride (AlN); glass or silicon may also be used. If silicon is used, the substrate 11 may, itself, be a semiconductor element similar to the semiconductor chip 10, so that the method of the present invention is equally applicable to connecting two chips together. The term "substrate" as used herein, therefore, means not only an inert or ceramic substrate, but is equally applicable to a substrate for another semiconductor circuit component network or IC.

Use of a photo-sensitive adhesive layer, and so controlling the characteristics by photo-masking technology that only a portion of it will be hardened or cured, permits arranging the geometry of the adhesive layer in accordance with the desired configuration which is to be covered, or not, by the adhesive. The technology to do so is well known in connection with monolithic integrated semiconductor circuits. The arrangement of the geometry of the elements beneath the adhesive layer can be controlled for accuracy with tolerances in the range of less than and up to only 1 micrometer. The overlap of adhesive material which has not been cured is a minimum, so that danger of short circuits due to creep of the adhesive, and dispersion of metal, is a minimum. The position of the semiconductor substrate with respect to the carrier substrate can be carried out in automatic machinery which, by use of suitable and well known optical processes, permits spacings of less than 20 micrometers. The surface extent of the connecting metallizations, pads or lands 13, 16 can be reduced to a diameter which is less than 50 micrometers, so that center-to-center spacing of the lands or pads of less than 100 micrometers can be obtained.

The adhesive layer can be applied on the carrier substrate 11 and/or on the semiconductor or chip substrate 10. If the adhesive layer is applied to both the carrier substrate 11 as well as the chip 10, the electrically conductive powder, preferably silver can be introduced into the region above the respective pads 16, 13, of both the chip and substrate. Thus, if such an arrangement is used, the regions 510 (FIG. 5) would merge with the regions 310 (FIG. 6). This, however, requires a greater amount of silver powder.

The entire surface of the chip 10 will be on the carrier 11, but only the contacting pads 13, 16 are electrically connected. This entire surface contact—which is achieved upon slight additional compression (FIGS. 5, 6)—provides for excellent mechanical strength and good thermal contact. It is not necessary to provide for additional clamping or potting, but a passivation, for example a dielectric gel, is preferably applied to protect the entire hybrid, as well known in IC technology.

It is also possible to cure the adhesive layer on only one of the substrates, and hold the conductive particles, selectively, on the remaining tacky portions above the respective pads 16, 13, and not leave any of the metallic powder on the cured surface. A second uncured layer can be placed on the other one of the substrates so that, upon further compression of the parts against each other (referring to FIGS. 5 and 6), the adhesive extending over the entire surface which has not been cured will form a surface-adhesive bond between the substrate 11 and the chip 10, the non-exposed areas are cured by high-temperature process of about 150° C.

The semiconductor is made by standard processes and, for example, may be a bi-polar or MOS element, made by a variety of well known processes. Nickel and/or silver or gold layers 13', 15' to form reinforcements, can be applied by sputtering and/or plating processes. Applying the passivation layer is a standard procedure, and, for example, forms a standard oxide, nitride, or polyimide, and should, preferably, seal the semiconductor, for example for a plating process, and to protect the unit against environmental contamination or influences.

The photo process can be positive or negative, that is, the contacting pad could be made tacky when a non-tacky layer is applied, by using a material which, ordinarily, is non-tacky or adhesive but, upon exposure, becomes tacky and metal-accepting. Good thermal contact between the substrate 11 and the chip 10 (FIGS. 5, 6) is obtained by whole-surface contact. Additional adhesion can be obtained by re-softening the non-tacky, for example previously not entirely cured region, during the curing, or by adding a second thin layer of adhesive after photoforming of the electrical contacts and before high-temperature cure of the whole composite.

If the irradiation is carried out with respect to a material which becomes tacky when irradiated, the material 50 (FIGS. 3, 5) or 30 (FIGS. 4, 6) should be one which changes its characteristic under irradiation by radiant energy between forming a non-stick surface and a tacky surface and which, when irradiated, forms the tacky surface. In such cases, the photo-masking technique will provide for shielding of all portions except the regions above the pads or lands 13, 16 to form these regions to be tacky under irradiation, rather than to cure the remaining regions and leaving them tacky, as explained specifically in connection with FIGS. 2–6.

It is not necessary that the connecting lines 26, 27 are exposed metallic conductors on the surface of the semiconductor chip 19 or, for example, on the carrier substrate 11; they may, in whole or in part, be formed as diffused connecting layers, as well known in connection with the manufacture of integrated circuits. The connecting lands or pads 13, 16 will, however, be located at exposed surface regions to provide for connection to external circuitry, for example from the chip 10 to the substrate 11.

Various other changes and modifications may be made, and any features described herein may be used with any of the others, within the scope of the inventive concept.

I claim:

1. A method of making a hybrid semiconductor structure having
    a carrier plate substrate (11);
    a plurality of carrier connection pads (13) on a surface of said carrier plate substrate (11);
    a semiconductor chip or wafer substrate (10);
    a plurality of chip connecting pads (16) on a surface of said chip or wafer substrate (10),
    said method comprising, in accordance with the invention,
    applying, over the surface of at least one of said substrates, a layer (30; 50) of an electrically insulating adhesive which is photo-curable or hardenable;
    exposing to irradiation, by photo-masking technology, said adhesive layer (30; 50) while leaving unexposed the regions of said layer above the respective pads (13, 16),
    whereby said layer in said regions above the respective pads will remain adhesive and uncured;
    introducing a metal powder into said adhesive, uncured regions above said pads (13, 16) of said electrically insulating layer, to thereby render said regions electrically conductive, while leaving them adhesive;
    aligning the pads (13, 16) of said carrier plate substrate (11) and of said semiconductor chip or wafer substrate (10) with each other, and
    engaging said carrier plate substrate (11) and said semiconductor chip or wafer substrate (10) with each other such that said electrically conductive adhesive regions above the respective pads of said at least one substrate will engage and electrically connect the connecting pads (16) of the semiconductor chip or wafer substrate (10) and the connection pads (13) of the carrier plate substrate (11) to form both an electrical and adhesively mechanical connection between the carrier pads (13) and the chip pads (16) and hence between the carrier plate substrate and the semiconductor chip or wafer substrate and with said carrier plate substrate and the semiconductor chip or wafer substrate in face-to-face contact.

2. The method of claim 1, wherein said step of introducing the metal powder in said remaining adhesive regions above said pads (13, 16) comprises applying said powder to said regions under condition of vibration, shaking or centrifugal force or pressing in during assembly.

3. The method of claim 1, wherein said metal powder comprises silver powder.

4. The method of claim 1, including the step of forming a passivating layer (28, 40) on at least one of said surfaces, while leaving the respective pads (13, 16) of the respective surface free from the passivating layer, and then carrying out said step of applying said layer of photo-curable or hardenable electrically insulating adhesive over the passivating layer.

5. The method of claim 1, wherein at least one of said substrates includes connecting lines (14, 26, 27) extending from said pads on the surface of the respective substrate,
  including the step of forming a passivating layer over the respective surface and the respective connecting lines (14, 26, 27), while leaving the respective pads (13, 16) free from the passivating layer;
  and then carrying out said step of applying said layer of photo-curable or hardenable electrically insulating adhesive over the passivating layer.

6. The method of claim 1, wherein at least one of said substrates includes connecting lines (14; 26, 27) extending from the respective pads on the surface of the respective substrate, and
  wherein said step of applying said layer of photocurable or hardenable electrically insulating adhesive includes applying said adhesive over said connecting lines.

7. The method of claim 1, wherein said step of aligning the pads of said substrates with each other comprises aligning the pads with said surfaces facing each other with an alignment tolerance of less than 20 micrometers.

8. The method to claim 1, wherein said adhesive layer (50) is applied to the carrier plate substrate (11).

9. The method of claim 8, further including the step of applying a passivating layer (40) on said carrier plate substrate (11) prior to carrying out said step of applying said layer of insulating adhesive, leaving the pads (13) unpassivated,
  and further including the step of passivating the surface of the semiconductor chip substrate (10), while leaving the pads (16) thereon unpassivated.

10. The method of claim 8, including the step of reinforcing said pads (13) by a reinforcing material (13') having a thickness greater than the thickness of said passivating layer (40), said reinforcing material optionally comprising at least one of: nickel, silver, gold.

11. The method of claim 1, wherein said adhesive layer (30) is applied on said semiconductor chip or wafer substrate (10).

12. The method of claim 11, further including the step of passivating said surface of said semiconductor chip or wafer substrate (10) prior to carrying out said step of applying said adhesive thereover, while leaving said pads (16) unpassivated;
  and further including the step of reinforcing the connecting pads (16) by a reinforcing material (16') having a thickness greater than the thickness of said passivating layer, said reinforcing materials optionally comprising at least one of: nickel, silver, gold.

13. The method of claim 1, wherein said step of applying said electrically insulating photo-curable or hardenable adhesive comprises applying said adhesive over both said carrier plate substrate (11) and said semiconductor chip or wafer substrate (10);
  said irradiation exposing step comprises exposing to radiant energy at least one of said layers while leaving the regions above the respective pads (13, 16) of both said substrates uncured;
  and said step of introducing a metal powder comprises introducing said metal powder into at least one of said regions above the respective pads.

14. The method of claim 1, wherein said step of engaging said carrier plate substrate (11) and said semiconductor chip or wafer substrate (10) with each other comprises engaging said substrates to form surface contacts over essentially the entire surfaces of the respective substrates to form a thermally coupled, and electrically insulated, except for said pads, composite structure.

15. The method of claim 1, wherein said step of applying said photo-curable or hardenable layer is carried out over the surfaces of both said substrates (11, 10);
  said exposure step is carried out over the surface of only one of said substrates, leaving the entire surface applied over the other of said substrates uncured and tacky;
  and said step of engaging said substrates comprises engaging said substrates in contact with said surfaces, whereby the uncured, tacky surface will adhere to the cured, hardened surface portions of the other substrate, and form a mechanically and thermally coupled composite semiconductor structure.

16. The method of claim 1, wherein the particle size of the metal powder introduced into the uncured adhesive regions above said pads is in the order of between 1 to 5 micrometers.

17. A method of making a hybrid semiconductor structure having
  a carrier plate substrate (11);
  a plurality of carrier connection pads (13) on a surface of said carrier plate substrate (11);
  a semiconductor chip or wafer substrate (10);
  a plurality of chip connecting pads (16) on a surface of said chip or wafer substrate (10),
  said method comprising, in accordance with the invention,
  applying, over the surface of at least one of said substrates, a layer (30, 50) of a material which changes its characteristics under irradiation by radiant energy, between a tacky surface and a non-sticking surface;
  selectively irradiating said material to radiant energy to form tacky surfaces above the pads (13, 16) and a non-tacky surface over the remainder of the material;
  introducing a metal powder into the tacky portions of the adhesive above the respective pads (13, 16) of said electrically insulating layer to thereby render said tacky regions electrically conductive;
  aligning the pads (13, 16) of said substrates (11, 10) with each other; and
  engaging said carrier plate substrate (11) and said semiconductor chip or wafer substrate (10) with each other such that said electrically conductive adhesive regions above the respective pads of said at least one substrate will engage against the pads of the other substrate to thereby electrically connect the connecting pads (16) of the semiconductor chip or wafer substrate (10) and the connection pads (13) of the carrier plate substrate (11) to form an electrical and mechanical connection between the carrier pads (13) and the chip pads and a tacky connection upon engagement of said carrier plate substrate (11) and said semiconductor chip or wafer substrate (10).

18. The method of claim 1, wherein said adhesive layer which, in unhardened condition and above said pads has the characteristics of permitting migration or penetration of said metal powder throughout the layer to thereby render said regions electrically conductive.

19. The method of claim 1, wherein said radiant energy comprises ultraviolet light.

20. A composite hybrid semiconductor structure having
- a carrier plate substrate (11);
- a plurality of carrier connection pads (13) on a first carrier surface of said carrier plate substrate (11);
- a semiconductor chip or wafer substrate (10);
- a plurality of chip connecting pads (16) on a first chip surface and within the outline of said semiconductor chip or wafer substrate (10), comprising, in accordance with the invention,
- a layer of electrically conductive tacky material positioned over the pads (13, 16) on at least one of said substrates;
- a layer of electrically insulating material on at least one of said substrates, and covering the surface thereof except in the region of said pads,
- said substrates being engaged in first carrier surface-to-first chip surface, face-to-face contact against each other, with said pads facing each other, in electrically conductive connection by said electrically conductive tacky material and in adhesive connection by said tack material.

21. The structure of claim 20, further including a passivating layer (28, 40) formed on the surface of at least one of said substrates beneath the cured, hardened insulating material layer.

22. The structure of claim 20, further including connecting lines (14; 26, 27) located on the surface of at least one of said substrates and positioned beneath said electrically insulated cured and hardened insulating layer.

23. The structure of claim 22, further including a passivating layer (28, 40) applied over the surface of at least one of said substrates and over the connecting lines on said at least one substrate, the cured, hardened insulating material being applied over said passivating layer.

24. The structure of claim 20, wherein said carrier plate substrate (11) comprises at least one of the materials: aluminum oxide ($Al_2O_3$); aluminum nitride (AlN), glass, silicon.

25. The structure of claim 20, further including a reinforcing material layer (13', 16') applied over said pads (13, 16), said reinforcing material layer comprising at least one of the materials: nickel; silver; gold.

26. The structure of claim 21, further including a reinforcing material layer (13', 16') applied over said pads (13, 16), said reinforcing material layer comprising at least one of the materials: nickel; silver; gold, said reinforcing material extending above said passivating layer.

27. The structure of claim 20, wherein said plurality of pads on said substrate have clearance spaces of only up to about 20 micrometers.

* * * * *